United States Patent
Swanson et al.

(10) Patent No.: US 6,493,259 B1
(45) Date of Patent: Dec. 10, 2002

(54) PULSE WRITE TECHNIQUES FOR MAGNETO-RESISTIVE MEMORIES

(75) Inventors: Richard W. Swanson, Zimmerman, MN (US); William J. Johnson, Hopkins, MN (US); Theodore Zhu, Maple Grove, MN (US); Anthony S. Arrott, Washington, DC (US)

(73) Assignee: Micron Technology, Inc., Boise, ID (US)

(*) Notice: Subject to any disclaimer, the term of this patent is extended or adjusted under 35 U.S.C. 154(b) by 46 days.

(21) Appl. No.: 09/638,637

(22) Filed: Aug. 14, 2000

(51) Int. Cl.$^7$ .................................................. G11C 11/00
(52) U.S. Cl. ........................ 365/158; 365/161; 365/171
(58) Field of Search ............................ 365/158, 161, 365/145, 173, 149, 171, 209, 225.5, 230.07, 243.5

(56) References Cited

U.S. PATENT DOCUMENTS

| | | | |
|---|---|---|---|
| 3,573,485 A | 4/1971 | Ballard .......................... 307/88 |
| 4,132,904 A | 1/1979 | Harari .......................... 307/238 |
| 4,553,053 A | 11/1985 | Ong et al. ........................ 307/530 |
| 4,731,757 A | 3/1988 | Daughton et al. ........... 365/173 |
| 4,751,677 A | 6/1988 | Daughton et al. ........... 365/158 |
| 4,754,431 A | * 6/1988 | Jenson ........................... 365/158 |
| 4,829,476 A | 5/1989 | Dupuis et al. ............... 365/158 |
| 4,887,236 A | 12/1989 | Schoemann ................. 365/173 |
| 4,897,288 A | * 1/1990 | Jenson ........................... 365/158 |
| 5,349,302 A | 9/1994 | Cooper ......................... 365/207 |
| 5,361,226 A | 11/1994 | Taguchi et al. ............... 365/171 |
| 5,434,826 A | 7/1995 | Ravipati et al. ............. 367/140 |
| 5,515,314 A | 5/1996 | Kouhei et al. ................ 365/158 |
| 5,587,943 A | 12/1996 | Torok et al. ................... 365/158 |
| 5,595,830 A | 1/1997 | Daughton ..................... 428/611 |
| 5,640,343 A | 6/1997 | Gallagher et al. ........... 365/171 |
| 5,650,887 A | 7/1997 | Dovek et al. ................. 360/75 |
| 5,650,958 A | 7/1997 | Gallagher et al. ........... 365/173 |
| 5,654,566 A | 8/1997 | Johnson ....................... 257/295 |
| 5,695,864 A | 12/1997 | Slonczewski ................ 428/212 |
| 5,701,222 A | 12/1997 | Fontana, Jr. et al. ........ 360/113 |
| 5,701,223 A | 12/1997 | Gill et al. ..................... 360/113 |
| 5,748,519 A | 5/1998 | Tehrani et al. ................ 365/98 |
| 5,776,537 A | 7/1998 | Ryan et al. ..................... 427/8 |
| 5,801,529 A | 9/1998 | Umemoto et al. ..... 324/207.12 |
| 5,861,328 A | 1/1999 | Tehrani et al. .............. 438/210 |
| 5,982,658 A | * 11/1999 | Berg et al. ................... 365/158 |
| 6,134,138 A | * 10/2000 | Lu et al. ....................... 365/158 |
| 6,147,922 A | * 11/2000 | Hurst et al. .................. 365/158 |
| 6,175,525 B1 | * 1/2001 | Fulkerson et al. .......... 365/158 |
| 6,191,972 B1 | * 2/2001 | Miura et al. ................. 365/158 |
| 6,296,027 B1 | * 10/2001 | Bender et al. ................ 141/18 |
| 6,317,359 B1 | * 11/2001 | Black et al. ................. 365/158 |
| 6,341,084 B2 | * 1/2002 | Numata et al. ............. 365/158 |

FOREIGN PATENT DOCUMENTS

| | | |
|---|---|---|
| EP | 0 776 011 A2 | 5/1997 |
| EP | 0 776 011 A3 | 11/1997 |
| WO | WO 98/20496 | 5/1998 |

OTHER PUBLICATIONS

B Razavi and B.A. Wooley, "Design Techniques for High Speed, high Resolution Comparators," *IEEE Journal of Solid State Circuits*, vol. 27, pp. 1916–1926, Dec. 1992.

\* cited by examiner

*Primary Examiner*—Richard Elms
*Assistant Examiner*—Hien Nguyen
(74) *Attorney, Agent, or Firm*—Knobbe, Martens, Olson & Bear, LLP

(57) ABSTRACT

A magneto-resistive memory that has a shared word line and sense line is disclosed. By providing the shared word line and sense line, the number of relatively large drivers required to drive the word line and sense line currents can be reduced. This reduces the peripheral overhead of the memory, and may increase the overall density and reduce the overall power of the memory.

20 Claims, 7 Drawing Sheets

Prior Art

PULSE WRITE TECHNIQUES FOR MAGNETO-RESISTIVE MEMORIES

CROSS-REFERENCE TO RELATED CO-PENDING APPLICATIONS

This Application is related to U.S. Pat. No. 6,269,027 issued Jul. 31, 2001, and entitled "NON-VOLATILE STORAGE LATCH", U.S. Pat. No. 6,175,525 issued Jan. 16, 2001, and entitled "NON-VOLATILE STORAGE LATCH" and U.S. Pat. No. 6,147,922 issued Nov. 14, 2000, and entitled "NON-VOLATILE STORAGE LATCH", all of which are incorporated herein by reference.

The Government has rights in this invention pursuant to Contract No. MDA972-98-C-0021, throught the Defense Advanced Research Project Agency.

BACKGROUND OF THE INVENTION

The present invention relates to ferromagnetic thin film memories and, more particularly, to ferromagnetic thin film memories in which states of the memory cells based on magnetization direction are determined through magnetoresistive properties of the thin film sensed by an electronic circuit.

Digital memories of various kinds are used extensively in computers and computer system components, in digital processing systems, and the like. Such memories can be formed, to considerable advantage, based on the storage of digital bits as alternative states of magnetization in magnetic materials in each memory cell, typically thin film materials. These films may be ferromagnetic thin films having information stored therein through the direction of the magnetization occurring in that film, with this information being obtained through either inductive sensing to determine the magnetization state, or by magnetoresistive sensing of such states. Such ferromagnetic thin film memories may be conveniently provided on the surface of a monolithic integrated circuit to provide easy electrical interconnection between the memory cells and the memory operating circuitry.

Ferromagnetic thin film memory cells can be made very small and packed very closely together to achieve a significant density of stored digital bits, properties which permit them to be provided on the surface of a monolithic integrated circuit as indicated above. One construction, as an example, is shown in FIG. 1, where a bit structure 10 for a memory cell that is presented is formed over a semiconductor material body 12, as used in a monolithic integrated circuit, and directly on an insulating layer 13, itself supported on a major surface of body 12 in the integrated circuit. Only a small portion of the integrated circuit is shown, and then only a small portion of the semiconductor body is shown in that integrated circuit portion.

These bit structures in an assemblage in a memory are usually provided in a series string of such bit structures often called sense lines. There are typically a plurality of such sense lines in a memory. In order to make interconnections between members of such sense lines, or between the sense lines and the external circuitry in the integrated circuit for operating the memory, terminal regions or junctures 14 are typically provided at each end of the bit structure for interconnection purposes. These interconnections might be formed of copper alloyed in aluminum.

The remainder of the bit structure disposed on the exposed major surface of insulating layer 13 includes a lower ferromagnetic thin film 15 and an upper ferromagnetic thin film 16. Ferromagnetic thin film layers 15 and 16 typically exhibit uniaxial anisotropy, magnetoresistance, little magnetostriction, and are of an alloy composition typically comprising nickel, cobalt and iron. The magnetic device structure can be a spin valve that includes a pinned reference layer 15 spaced apart from a "free layer" that stores the digital information. The lower ferromagnetic thin film 15 is typically, but not always, thicker than the upper ferromagnetic thin film 16. Alternatively, a pseudo-spin-valve structure can be used where the lower ferromagnetic thin film 15 is often called the hard layer, and the upper ferromagnetic thin film 16 is often called the soft layer.

Between ferromagnetic thin film layers 15 and 16 is typically a further thin layer 17 which usually would not exhibit ferromagnetism but may be either an electrical conductor or an electrical insulator. Layer 17 must, however, in this construction, minimize the exchange interaction between layers 15 and 16 so that the magnetization vectors of each layer are decoupled. A typical choice for layer 17 would be copper. An insulating layer 18 covers bit structure 10 although only a part of it is shown in FIG. 1.

Finally, a word line 19 is shown in FIG. 1 disposed on the major surface of insulating layer 18. Word line 19 typically includes an aluminum layer alloyed with copper on a titanium-tungsten base layer. A protective and insulating layer over the entire structure of FIG. 1 is often used in practice, but is not shown here.

Bit structure 10 can be operated in a longitudinal mode having its easy axis extend between internal interconnections 14 perpendicular to the direction of word line 19. Information kept as a digital bit having one of two alternative logic values in bit structure 10 is stored therein in layer 15 by having the magnetization vector point in one direction or the other, generally along the easy axis of magnetization. If the direction of magnetization is caused to rotate from such a direction by external magnetic fields, the electrical resistance of layers 15 and 16 changes with this magnetization direction rotation because of the magnetoresistive properties of such layers. For the kinds of materials typically used in layers 15 and 16, the maximum change in resistance is on the order of a few percent of the minimum resistance value.

Sense current refers to the current flow through bit structure 10 from one terminal 14 to the other terminal 14 thereof, and word current refers to current flowing in word line 19 adjacent to, and transverse to the orientation of, bit structure 10. Bit structure 10 can be placed in one of the two possible magnetization states of layer 15 (pinned layer) through the selective application of sense and word currents i.e., information can be "written" in bit structure 10. A bit structure 10 of a typical configuration can be placed in a "0" magnetization state by the application of a sense current of typically 1.0 mA, and coincidentally with the provision of a word current in one direction from 20 mA to 40 mA. The opposite magnetization state representing a "1" logic value can be provided through providing the same sense current and a word current of the same magnitude in the opposite direction. Such states typically occur fairly quickly after the proper current levels are reached, such state changes typically occurring in less than about 5 ns.

Determining which magnetization state is stored in bit structure 10 i.e., reading the information stored in bit structure 10, is typically done by providing externally caused magnetic fields in that bit structure, through providing, for example, wordline currents and sometimes coincident sense line currents. These currents rotate the magnetization of the upper ferromagnetic thin film 16 (free layer) of the bit structure 10, but preferably not the lower ferromagnetic thin film 15 (pinned layer). As indicated above, this causes a change in the electrical resistance encountered between terminal regions 14 in bit structure 10 for different magnetization directions in the structure, including changing from one easy axis direction magnetization state to the opposite direction state. As a result, there is detectable differences in the voltage developed across magnetic bit structure 10 by the sense current flowing therethrough, depending on the relative magnetization direction of the pinned and free layers of bit structure 10.

As the size of the bit structure 10 decreases, the magnetic field required to rotate the upper ferromagnetic thin film 16 and the lower ferromagnetic thin film 15 also tend to increase. Accordingly, the magnitude of the word line currents and sense lines currents increase. Depending on the technology used, this may cause the electro-migration limits of the metal interconnect layers to be exceeded. To help compensate for this, a digital line is sometimes provided over the bit structure 10 parallel with the sense line. The digital line provides an additional metal layer for carrying the required current, and provides additional lateral torque at the bit structure 10.

A limitation of many prior art magneto-resistive memories is that both sense lines and word lines are separately provided. Each of the sense lines and word lines typically requires a separate and often relatively large driver, which can result in significant peripheral overhead. This peripheral overhead often decreases the overall density of the memory and increases the overall power, both of which are undesirable.

SUMMARY OF THE INVENTION

The present invention overcomes many of the disadvantages of the prior art by providing a magneto-resistive memory that has a shared word line and sense line. By providing a shared word line and sense line, the number of relatively large drivers required to drive the word line and sense line currents may be reduced. This may reduce the peripheral overhead of the memory, and may increase the overall density and reduce the overall power of the memory.

In accordance with one illustrative embodiment of the present invention, a word line is provided adjacent a magneto-resistive bit. Rather than providing a separate sense line that interconnects the bit ends of the magneto-resistive bit to adjacent bits, one end of the magneto-resistive bit is connected to the word line and the other end is connected to a predetermined voltage such as ground through a switch or the like. The switch, which is preferably a transistor, selectively provides a path for a sense current to flow from the word line, through at least part of the magneto-resistive bit, and to the predetermined voltage. Accordingly, the word line may deliver both the word line current and the sense line current for the magneto-resistive bit. As such, no separate sense line current driver is required. Instead, a relatively small buffer or the like may be used to activate the switch, which then draws the sense line current from the word line.

Preferably, the magneto-resistive bit is elongated and has a length and a width. The magnetization vector of the pinned layer of the magneto-resistive bit preferably remains in a predetermined direction. Thus, the magneto-resistive bit may be written to a desired magneto-resistive state by changing the magnetization vector of only the free layer. The word line carries a word line current that produces a word line magnetic field component along the length of the elongated magneto-resistive bit. The word line magnetic field component provides the longitudinal force for switching the magnetization vector of the free layer of the magneto-resistive bit. The sense current, which passes through at least part of the magneto-resistive bit, preferably produces a sense magnetic field component that extends along the width of the elongated magneto-resistive bit. The sense magnetic field component provides the lateral torque sometimes necessary to initiate the rotation of the magnetization vector of the free layer of the magneto-resistive bit. A digital line may also be provided adjacent the magnetoresistive bit to provide additional lateral torque, if desired.

During a write operation, a word line current is provided to the word line, and the switch is activated. The switch draws a write sense current from the word line and through the magneto-resistive bit. The magnetic fields produced by the word line current and the write sense current are preferably sufficient to write the free layer of the magneto-resistive bit to the desired magneto-resistive state.

During a read operation, a word line current is not provided. Instead, a read circuit provides a path for a read sense current to flow to the word line. The switch is again activated, which draws the read sense current through the magneto-resistive bit. The read circuit senses the resistive state of the magneto-resistive bit by sensing the magnitude of the read sense current or by sensing the voltage drop across the magneto-resistive bit.

During a write operation, it is desirable to limit the magnitude of the write sense current so that the magnetic bit is not damaged by the current. During a read operation, it is desirable to reduce the resistance that is in series with the magneto-resistive bit to maximize the sensitivity to the resistance change of the GMR bits. Accordingly, it is contemplated that the switch may have at least two resistive modes including an intermediate resistive mode and a lower resistive mode. The intermediate resistance mode may provide a limiting resistance in series with the magneto-resistive bit to limit the amount of write sense current that is drawn from the word line during a write operation. The lower resistance mode may be used to reduce the resistance that is in series with the magneto-resistive bit during a read operation to maximize the sensitivity of the read operation.

When the switch includes a transistor, the intermediate resistive mode may be provided by operating the transistor in the saturation region, where the current flowing through the transistor is controlled by the voltage on the gate of the transistor. By providing an appropriate voltage to the gate of the transistor, the desired write sense current can be provided. The lower resistance mode may be provided by operating the transistor in the linear region, with the transistor fully turned on.

It is contemplated that the switch may also have a higher resistive mode for substantially preventing the write sense current and the read sense current from flowing from the word line. This higher resistance mode may allow the magneto-resistive bit to be deselected, which may be particularly important when multiple magneto-resistive bits are controlled by the same word line.

To provide a differential magneto-resistive output signal, it is contemplated that a magneto-resistive storage element may be provided that includes two magneto-resistive bits. In this illustrative embodiment, the word line may extend adjacent the first and second magneto-resistive bits. The word line may be connected to the first end of the first magneto-resistive bit and the first end of the second magneto-resistive bit. The word line preferably extends adjacent the first magneto-resistive bit in a first direction and adjacent the second magneto-resistive bit in a second opposite direction. This may provide a word line magnetic field component that extends toward one end of the first magneto-resistive bit and toward the other end of the second magneto-resistive bit. Since the magnetization vector of the pinned layer of the first and second magneto-resistive bits preferably are in the same direction, this configuration causes the first and second magneto-resistive bits to be written into opposite magneto-resistive states.

As above, a switch is preferably coupled to the second end of the first magneto-resistive bit and the second end of the second magneto-resistive bit. The switch selectively provides a path for a write sense current and a read sense current to flow from the word line, through at least part of the first and second magneto-resistive bits, and to a predetermined voltage such as ground. The switch preferably has at least two resistive states including an intermediate resistive state and a lower resistive state.

During a write operation, a word line current is provided to the word line. The word line current provides a write magnetic field component toward one end of the first magneto-resistive bit and toward the other end of the second magneto-resistive bit. When the switch is activated, the write sense current is drawn from the word line current and through the first and second magneto-resistive bits. This causes the first magneto-resistive bit to be written to a first resistive state and the second magneto-resistive bit to a second opposite resistive state.

During a read operation, the word line is preferably divided into a first word line and a second word line, with the first word line extending adjacent the first magneto-resistive bit and the second word line extending adjacent the second magneto-resistive bit. This may be accomplished by providing a word line switch between the first word line and the second word line. The word line switch may be activated to connect the first word line and the second word line during a write operation, and may be deactivated to effectively disconnect the first word line from the second word line during a read operation.

It is recognized that in some embodiments, a word line switch may not be needed. For example, the first word line and the second word line may always be separated, even during a write operation. In this embodiment, the word line current does not traverse from the first word line to the second word line. Instead, a first word line current may be provided to the first word line, and a second word line current may be provided to the second word line. The polarity of the first and second word line currents may then be adjusted so that the first magneto-resistive bit and the second magneto-resistive bit are written into opposite resistive states.

A read circuit is preferably coupled to the first word line and the second word line. The read circuit provides a path for a first read sense current to the first word line and a second read sense current to the second word line. The first read sense current and the second read sense current are preferably substantially identical. The switch or switches in the magneto-resistive element are activated to draw the first read sense current through the first magneto-resistive bit and the second read sense current through the second magneto-resistive bit. The read circuit senses the resistive state of the magneto-resistive bits by sensing the difference between the first read sense current and the second read sense current, or the differential voltage at the first ends of the first and second magneto-resistive bits.

It is contemplated that the read circuit may include a latch circuit similar to that shown in co-pending U.S. patent application Ser. No. 09/059,871, filed Apr. 14, 1998, and entitled "NON-VOLATILE STORAGE LATCH", U.S. patent application Ser. No. 09/396,189, filed Sep. 14, 1999 and entitled "NON-VOLATILE STORAGE LATCH", and U.S. patent application Ser. No. 09/429,664, filed Oct. 28, 1999, and entitled "NON-VOLATILE STORAGE LATCH", all of which are incorporated herein by reference. More specifically, the read circuit may include a latch circuit that includes a first inverter and a second inverter coupled together in a cross-coupled configuration. The latch circuit preferably also includes a load transistor coupled between the input terminals of the first and second inverters. The load transistor is used to load the state on the negative supply terminals of the first and second inverters into the latch circuit.

In accordance with this embodiment of the present invention, the first word line may be coupled to the negative supply terminal of the first inverter, and the second word line may be coupled to the negative supply terminal of the second inverter. The first end of the first magneto-resistive bit is preferably coupled to the negative supply terminal of the first inverter via the first word line, and the first end of the second magneto-resistive bit is preferably coupled to the negative supply terminal of the second inverter via the second word line. During a read operation, the second ends of the first and second magneto-resistive bits are preferably coupled to ground via a switch or the like, as described above.

In this configuration, when the load transistor of the read circuit is activated, identical sense line currents are provided to the first word line and the second word line via the negative supply terminals of the first and second inverters. With the switch enabled, the first and second read sense line currents pass through the first and second magneto-resistive bits, respectively. Since the first and second magneto-resistive bits are in opposite resistive states, the voltage at the negative supply terminals of the latch circuit is not equal. Thus, when the load transistor is deactivated, the latch circuit assumes the state that corresponds to the voltage differential between the negative supply terminals of the first and second inverters. This state corresponds to the resistive state of the magneto-resistive bits.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
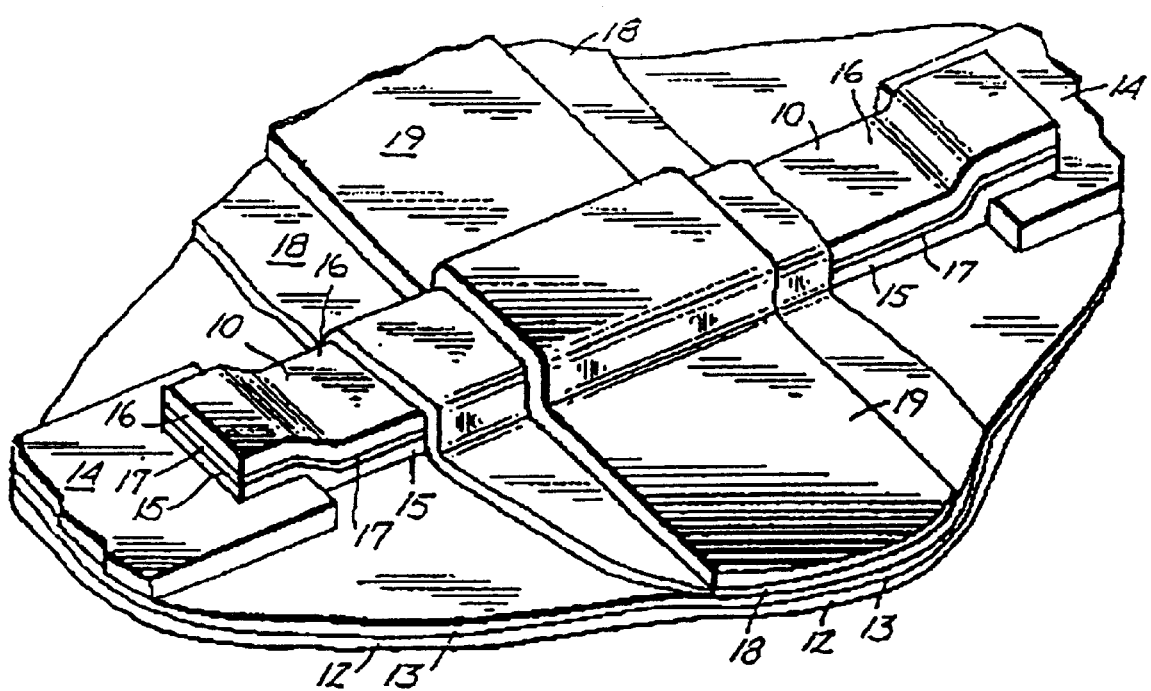
FIG. 1 is a partial cut-away perspective view of a prior art magneto-resistive memory.
Figure 2:
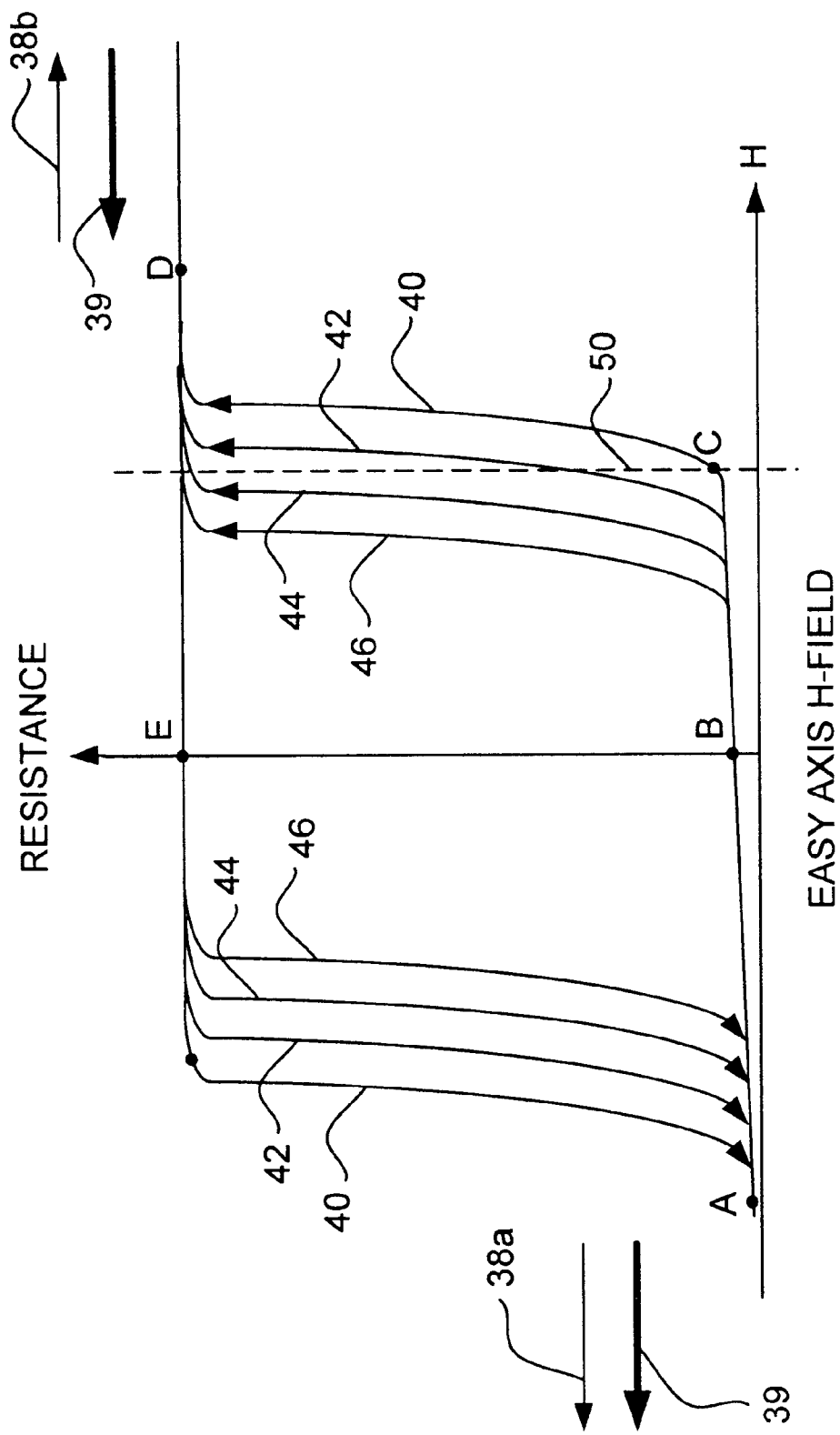
FIG. 2 is a graph showing illustrative minor loops of a magneto-resistive bit as a function of the write sense current.

FIG. 2 is a graph showing a number of illustrative minor loops of a GMR magneto-resistive bit as a function of write sense current. The x-axis of the graph illustrates the applied easy axis magnetic field, which in the example shown, corresponds to the word line magnetic field component that extends along the length of the magneto-resistive bit. The y-axis of the graph illustrates the corresponding resistance of the magneto-resistive bit assuming the magnetic field vector 39 of the pinned layer of the magneto-resistive bit remains pointing to the left, as shown.

At point A, the magnetization vector 38a of the free layer and the magnetization vector 39 of the pinned layer point to the left, which in the example shown, corresponds to a negative word line magnetic field. During a write operation, the word line magnetic field is first reduced to zero, which corresponds to point B. During this transition, the magneto-resistive state of the magneto-resistive bit does not change. The word line magnetic field is then increased in a positive direction to point C. As the word line magnetic field increases beyond point C, the magnetization vector of the free layer switches state, resulting in a higher bit resistance as indicated at point D. In this state, the magnetization vector 38b of the pinned layer points to the right.

To return the magneto-resistive bit to its original state, the word line magnetic field is again reduced to zero, which corresponds to point E, and is then increased in a negative direction to point F. As the word line magnetic field increases beyond point F, the magnetization vector of the free layer again switches state, resulting in a lower bit resistance as indicated at point A. In this state, the magnetization vector 38a of the free layer points to the left, as shown.

An increase in the magnitude of the sense line magnetic field can often reduce the word line magnetic field that is required to switch the state of the free layer of the magneto-resistive bit. Minor loop 40, which corresponds to the smallest sense line magnetic field present, requires the highest word line magnetic field to switch the state of the free layer. Minor loops 42, 44 and 46, which have increasingly larger sense line magnetic fields, require increasingly smaller word line magnetic fields to switch the state of the free layer. This phenomenon can often be used to provide selectivity to a memory, and no digital line may be required.

To further illustrate the selectivity that can often be provided by the sense line current, a specific word line magnetic field (and thus a specific word line current) is shown at 50. Those magneto-resistive bits that have an insufficient sense line magnetic field, such as those corresponding to minor loops 40 and 42, will not be written. However, those magneto-resistive bits that have a sense line magnetic field that is greater than a threshold level, such as those corresponding to minor loops 44 and 46, will be written. Accordingly, it is contemplated that the present invention may provide the desired selectivity using only a sense line, and may not require a digital line. However, it is contemplated that a digital line may be provided, if desired.

Figure 3:
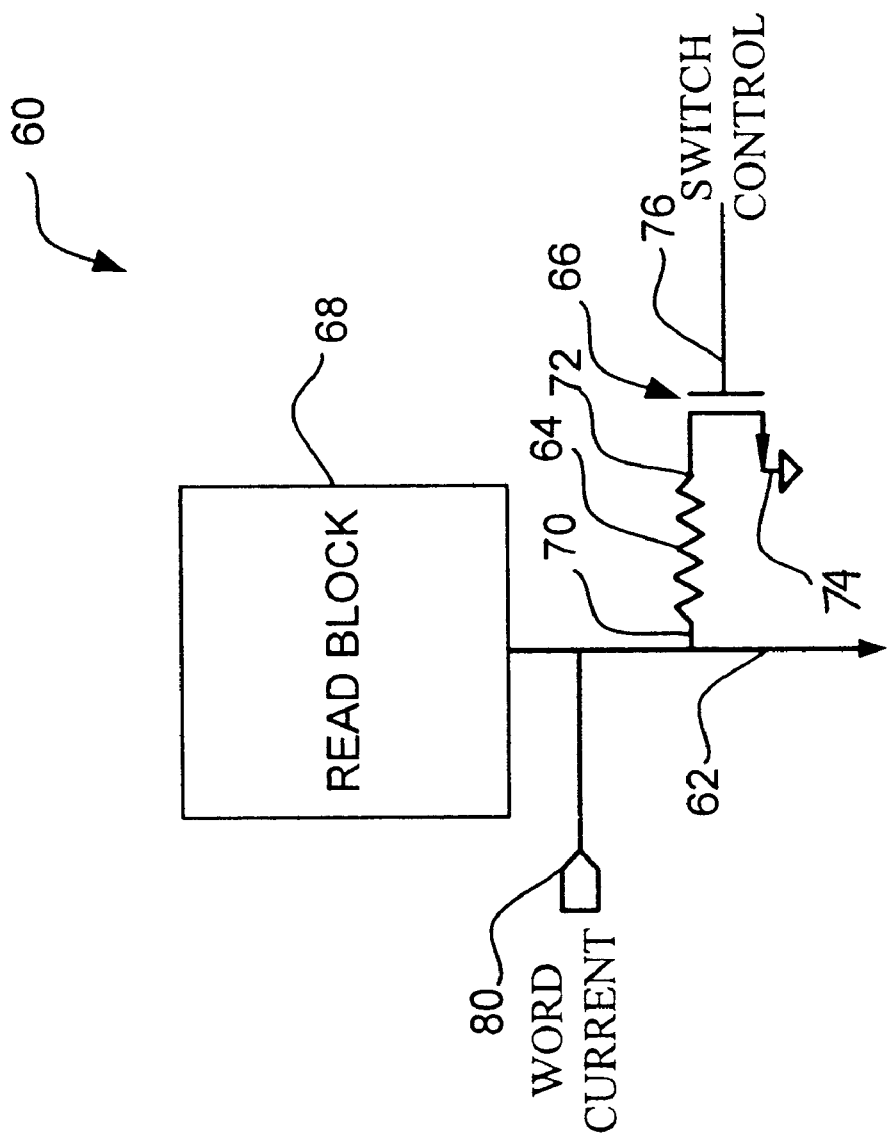
FIG. 3 is a schematic diagram showing an illustrative magneto-resistive memory having a shared word line and sense line.

FIG. 3 is a schematic diagram showing an illustrative magneto-resistive memory having a shared word line and sense line. The illustrative magneto-resistive memory is generally shown at 60 and includes a word line 62, a magneto-resistive bit 64, a switch 66 and a read block 68.

The word line 62 is provided adjacent the magneto-resistive bit 64 to provide a word line magnetic field at the magneto-resistive bit. Preferably, the word line 62 extends over or under the magneto-resistive bit, as further shown in FIGS. 6–8 below. One end 70 of the magneto-resistive bit 64 is preferably connected to the word line 62, and the other end 72 is preferably connected to a predetermined voltage 74 such as ground through switch 66. The switch 66, which is preferably a transistor, selectively provides a path for a sense current to flow from the word line 62, through at least part of the magneto-resistive bit 64, and to the predetermined voltage 74. Accordingly, the word line 62 may deliver both the word line current and the sense line current for the magneto-resistive bit 64. As such, no separate sense line current driver may be required. Instead, a relatively small buffer or the like may be used to control the switch 66 via the switch control terminal 76.

Preferably, the magneto-resistive bit 64 is elongated and has a length and a width. The word line 62 carries a word line current that produces a word line magnetic field component along the length of the elongated magneto-resistive bit 64. The word line magnetic field component provides the longitudinal force for switching the magnetization vector of the free layer of the magneto-resistive bit 64. The sense current, which passes through at least part of the magneto-resistive bit 64, preferably produces a sense magnetic field component that extends along the width of the elongated magneto-resistive bit 64. The sense magnetic field component provides the lateral torque sometimes necessary to initiate the rotation of the magnetization vector of the free layer of the magneto-resistive bit 64. A digital line (not shown) may also be provided adjacent the magneto-resistive bit 64 to provide additional lateral torque, if desired.

During a write operation, a word line current is provided to the word line 64 via word current terminal 80. The switch 66 is then activated via the switch control terminal 76, which draws a write sense current from the word line 62 and through the magneto-resistive bit 64. The magnetic fields produced by the word line current and the write sense current write the free layer of the magneto-resistive bit 64 to the desired magneto-resistive state. The read block 68 is preferably disabled to prevent any read sense currents from being provided to the word line 64.

During a read operation, the word line current is preferably not provided. Instead, the read block 68 provides a path for a read sense current to flow to the word line 62. The switch 66 is then activated, which draws a read sense current through the magneto-resistive bit 64. The read block 68 senses the resistive state of the magneto-resistive bit 64 by sensing the magnitude of the read sense current or by sensing the voltage drop across the magneto-resistive bit 64.

During a write operation, it is desirable to limit the magnitude of the write sense current so that sufficient word line current remains to effectively write the free layer of the magneto-resistive bit 64. In contrast, and during a read operation, it is desirable to reduce the resistance that is in series with the magneto-resistive bit 64 to maximize the sensitivity of the read operation. Accordingly, it is contemplated that the switch 66 may have at least two resistive modes including an intermediate resistive mode and a lower resistive mode. The intermediate resistance mode may provide a limiting resistance in series with the magneto-resistive bit 64 to limit the amount of write sense current that is drawn from the word line 62 during a write operation. The lower resistance mode may be used to reduce the resistance that is in series with the magneto-resistive bit 64 during a read operation to maximize the sensitivity of the read operation.

When switch 66 includes a transistor as shown, the intermediate resistive mode may be provided by operating the transistor in the saturation region, where the current flowing through the transistor is controlled by the voltage on the gate of the transistor (e.g., at the switch control terminal 76). By providing an appropriate voltage to the gate of the transistor, the desired write sense current can be provided. The lower resistance mode may be provided by operating the transistor in the linear region, with the transistor fully turned on.

It is contemplated that the switch 66 may further have a higher resistive mode for substantially preventing the write sense current and the read sense current from flowing from the word line 62. This higher resistance mode may allow the magneto-resistive bit 64 to be deselected, which may be particularly important when other magneto-resistive bits (see FIG. 4) are controlled by the same word line 62.

Figure 4:
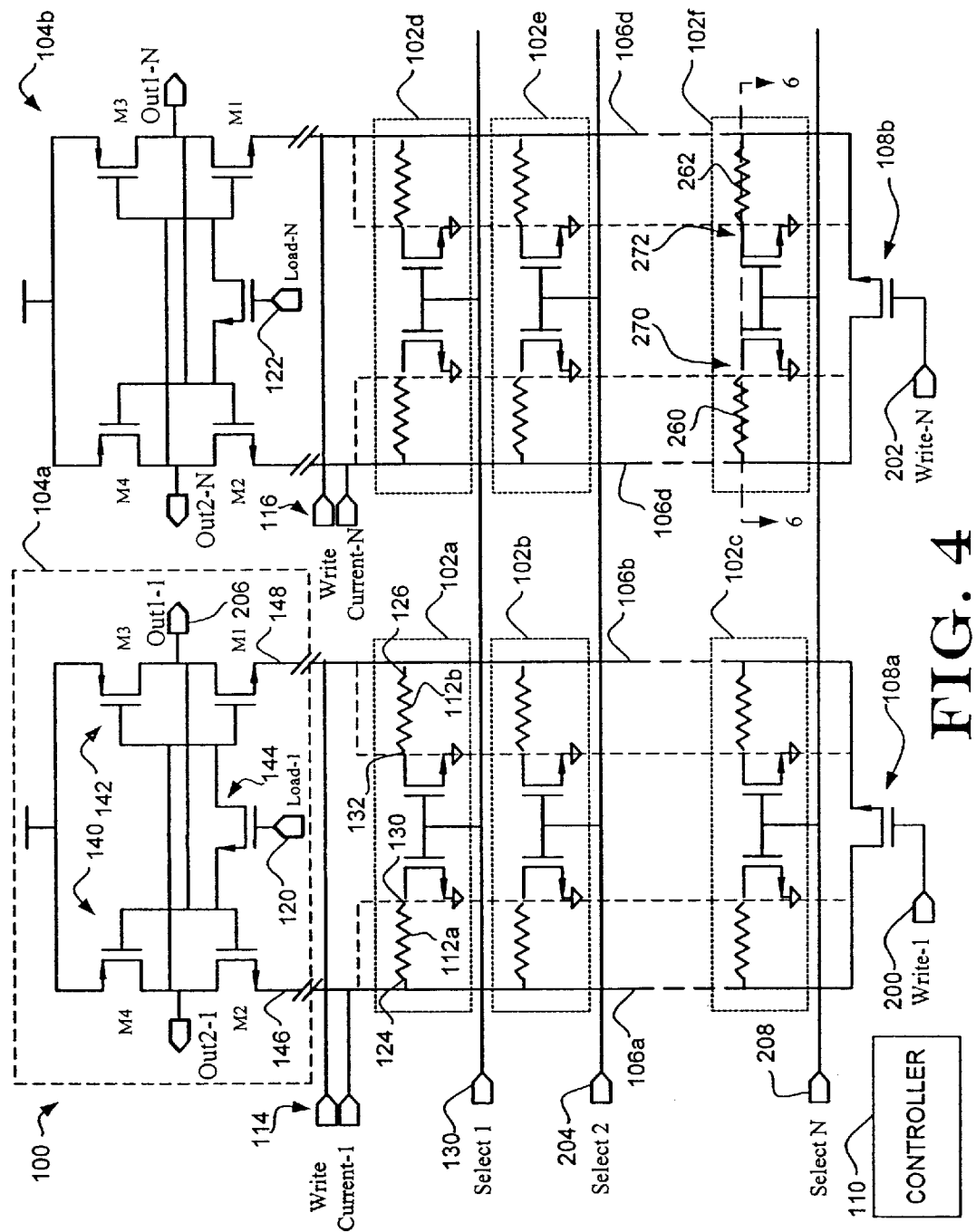
FIG. 4 is a schematic diagram showing a preferred magneto-resistive memory having shared word lines and sense lines.

FIG. 4 is a schematic diagram showing a preferred magneto-resistive memory having shared word lines and sense lines. The magneto-resistive memory is generally shown at 100, and includes a number of magneto-resistive memory elements 102a–f, a number of read circuits 104a and 104b, a number of word lines 106a–d, a number of word line switches 108a and 108b and a controller 110.

The memory architecture includes a number of columns and a number of rows. Each of the columns correspond to one of the read circuits 104a and 104b. During a write operation, a desired column can be selected by providing a word line current to the word lines that correspond to the desired column of magneto-resistive bits. For example, to select the column that includes read circuit 104a, a word line current may be provided to word lines 106a and 106b via write current-1 terminals 114. Likewise, to select the column that includes read circuit 104b, a word line current may be provided to word lines 106c and 106d via write current-N terminals 116.

During a read operation, the desired column can be selected by asserting the load terminal of the corresponding read circuit. For example, to select the column that includes read circuit 104a, the load-1 terminal 120 of read circuit 104a may be asserted. Likewise, to select the column that includes read circuit 104b, the load-N terminal 122 of read circuit 104b may be asserted. An advantage of this embodiment is that a differential magneto-resistive output signal is provided to the read circuits 104a and 104b, thereby potentially increasing the signal-to-noise ratio of the memory.

Each of the magneto-resistive storage elements 102a–f preferably include two magneto-resistive bits. The magnetization vector of the pinned layer of each of the magneto-resistive bits preferably remains in a common direction, such as pointing to the left. For clarity, the operation of magneto-resistive storage element 102a is described in detail. The remaining magneto-resistive storage elements 102b–f operate in a similar manner.

Magneto-resistive storage element 102a includes magneto-resistive bits 112a and 112b. Word line 106a extends adjacent the first magneto-resistive bit 112a, and word line 106b extends adjacent magneto-resistive bit 112b. Word line 106a is connected to the first end 124 of the first magneto-resistive bit 112a, and word line 106b is connected to the first end 126 of the second magneto-resistive bit 112b. Word lines 106a and 106b can be selectively connected via word line switch 108a during a write operation so that the word line current travels past the first magneto-resistive bit 112a in a first direction (e.g., downward), and past the second magneto-resistive bit 112b in a second opposite direction (e.g., upward). If word lines 106a and 106b are positioned above the first and second magneto-resistive bits 112a and 112b, respectively, the word line current produces a word line magnetic field component that extends to the right in the first magneto-resistive bit 112a and to the left in the second magneto-resistive bit 112b. Since the pinned layer of the first and second magneto-resistive bits 112a and 112b both preferably point in a common direction such as to the left, the first and second magneto-resistive bits 112a and 112b may be written into opposite magneto-resistive states.

Preferably, a switch is coupled to the second end 130 of the first magneto-resistive bit 112a and the second end 132 of the second magneto-resistive bit 112b. In the embodiment shown, the switch includes two identical transistors, each having a gate coupled to a select line, such as select-1 line 130. The switch may selectively provide a path for a write sense current and a read sense current to flow from the word lines 106a and 106b, through at least part of the first and second magneto-resistive bits 112a and 112b, and to a predetermined voltage such as ground. The switch preferably has at least two resistive states including an intermediate resistive state and a lower resistive state.

During a write operation, a word line current is provided, for example, down word line 106a, through write switch 108a, and up word line 106b. As indicated above, such a word line current produces a write magnetic field component that points to the right in the first magneto-resistive bit 112a and to the left in the second magneto-resistive bit 112b. When the switch is activated, a write sense current is drawn from the word line current and through the first and second magneto-resistive bits 112a and 112b. This causes the first magneto-resistive bit 112a to be written to a first resistive state and the second magneto-resistive bit 112b to a second opposite resistive state. Preferably, the read circuit 104a is disabled to prevent any read sense currents from being provided to word line 64.

During a read operation, the word line is preferably divided into a first word line 106a and a second word line 106b, with the first word line 106a extending adjacent the first magneto-resistive bit 112a and the second word line 106b extending adjacent the second magneto-resistive bit 112b. This is preferably accomplished by providing a word line switch 108a between the first word line 106a and the second word line 106b. The word line switch 106a may be activated to connect the first word line 106a and the second word line 106b during a write operation, and may be deactivated to effectively disconnect the first word line 106a from the second word line 106b during a read operation.

The read circuit 104a is preferably coupled to the first word line 106a and the second word line 106b. The read circuit 104a provides a path for a first read sense current to the first word line 106a and a second read sense current to the second word line 106b. The switch or switches in the magneto-resistive element are then activated to draw the first read sense current through the first magneto-resistive bit 112a and the second read sense current through the second magneto-resistive bit 112b. The read circuit 104a may sense the resistive state of the magneto-resistive bits 112a and 112b by sensing the difference between the first read sense current and the second read sense current. Alternatively, the read circuit 104a may sense the resistive state of the magneto-resistive bits 112a and 112b by sensing the differential voltage between the first ends 124 and 126 of the first and second magneto-resistive bits 112a and 112b, respectively.

It is contemplated that the read circuit 104a may include a latch circuit similar to that shown in co-pending U.S.

patent application Ser. No. 09/059,871, filed Apr. 14, 1998, and entitled "NON-VOLATILE STORAGE LATCH", U.S. patent application Ser. No. 09/396,189, filed Sep. 14, 1999, and entitled "NON-VOLATILE STORAGE LATCH", and U.S. patent application Ser. No. 09/429,664, filed Oct. 28, 1999, and entitled "NON-VOLATILE STORAGE LATCH", all of which are incorporated herein by reference. More specifically, the read circuit 104a may include a latch circuit that includes a first inverter 140 and a second inverter 142 coupled together in a cross-coupled configuration. The latch circuit preferably also includes a load transistor 144 coupled between the input terminals of the first and second inverters. The load transistor 144 is used to load the state that corresponds to the voltage difference on the negative supply terminals 146 and 148 of the first and second inverters 140 and 142, respectively, into the latch circuit.

The first word line 106a is coupled to the negative supply terminal 146 of the first inverter 140, and the second word line 106b is coupled to the negative supply terminal 148 of the second inverter 142. The first end 124 of the first magneto-resistive bit 112a is preferably coupled to the negative supply terminal 146 of the first inverter 140 via the first word line 106a, and the first end 126 of the second magneto-resistive bit 112b is preferably coupled to the negative supply terminal 148 of the second inverter 142 via the second word line 106b. During a read operation, the second ends 124 and 126 of the first and second magneto-resistive bits 112a and 112b, respectively, are coupled to ground via the switch or the like, as described above.

In this configuration, when the load transistor 144 of the read circuit 104a is activated, identical sense line currents are provided to the first word line 106a and the second word line 106b via the negative supply terminals 146 and 148 of the first and second inverters 140 and 142. With the switch in the magneto-resistive element 102a enabled via select-1 terminal 130, the first and second sense line currents pass through the first and second magneto-resistive bits 112a and 112b, respectively. Since the first and second magneto-resistive bits 112a and 112b are in opposite resistive states, the voltages at the negative supply terminals 146 and 148 of the latch circuit are not equal. Thus, when the load transistor 144 is deactivated, the latch circuit will assume the state that corresponds to the voltage differential between the negative supply terminals 146 and 148 of the first and second inverters 140 and 142. This state corresponds to the resistive state of the magneto-resistive bits 112a and 112b.

A controller 110 is preferably provided for controlling the various terminals including the write current-1 terminals 114, the select terminals such as select-1 terminal 130, the write-1 terminal, the load-1 terminal 120, the write current-N terminals 116, the write-N terminal, the load-N terminal 122, etc.

Figure 5:
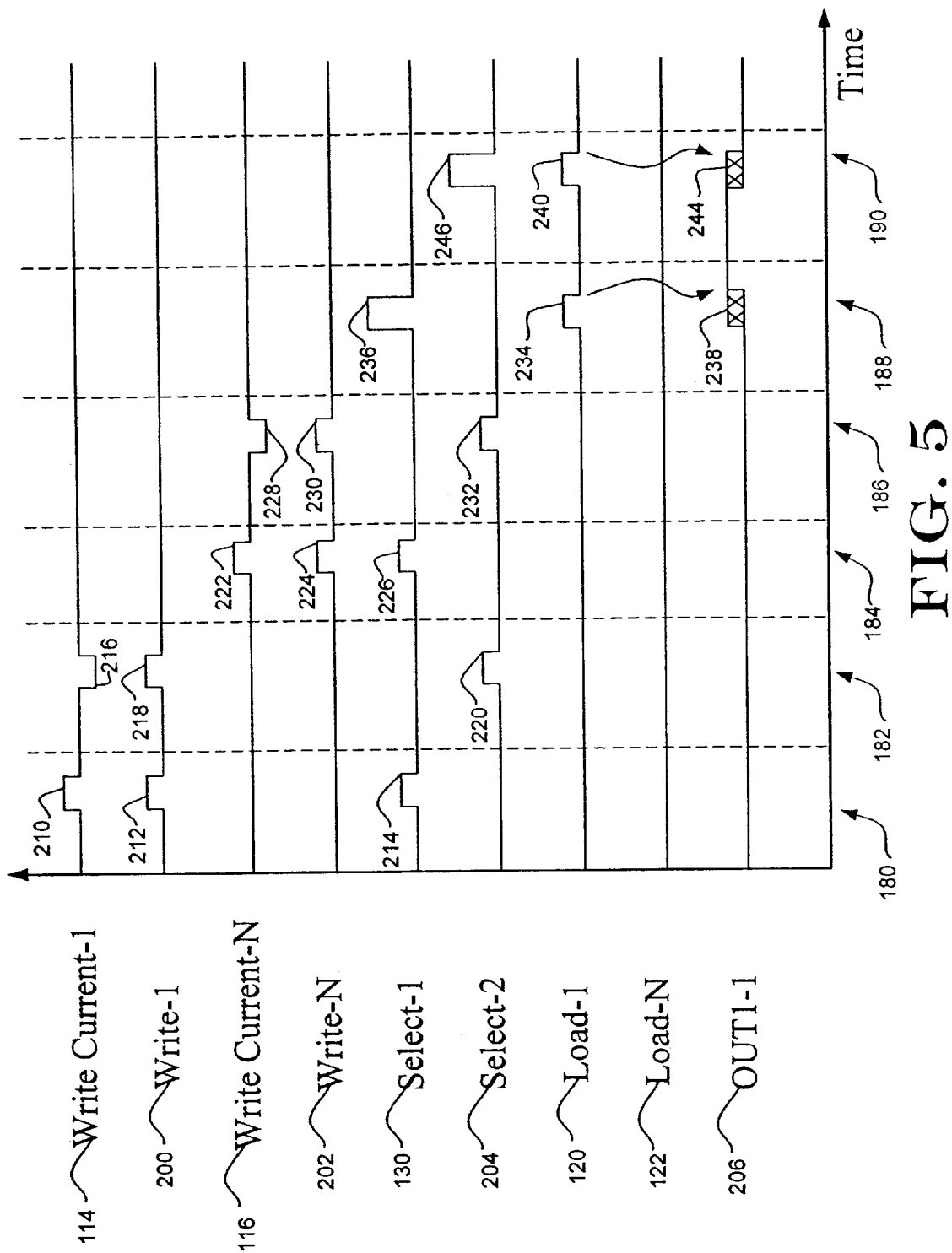
FIG. 5 is a timing diagram showing illustrative write and read operations of the magneto-resistive memory of FIG. 4.

FIG. 5 is a timing diagram showing illustrative write and read operations of the magneto-resistive memory of FIG. 4. The timing diagram is divided into six regions including regions 180, 182, 184, 186, 188 and 190. Region 180 shows a write operation that writes a "1" to magneto-resistive memory element 102a. The illustrative write operation begins with all control terminals deselected. These control terminals include write current-1 terminals 114, write current-N terminals 116, write-1 terminal 200, write-N terminal 202, select-1 terminal 130, select-2 terminal 204, select-N terminal 208, load-1 terminal 120, and load-N terminal 122.

The write current-1 terminals 114 are asserted to provide a positive write current pulse 210 to word lines 106a and 106b. The write-1 terminal 200 is also asserted as shown at 212, which closes the word line switch 108a and connects word lines 106a and 106b as shown. The word line current provided to write current-1 terminals 114 thus passes down word line 106a, through word line switch 108a, and up word line 106b. To select magneto-resistive memory element 102a, the select-1 terminal 130 is asserted as shown at 214. This turns on the switch transistors in magneto-resistive memory element 102a, which draw a sense current from word lines 106a and 106b and through magneto-resistive bits 112a and 112b. Preferably, the select-1 terminal 130 is only asserted to a level that allows the switch transistors in the magneto-resistive memory element 102a to operate in the saturation region to limit the magnitude of the sense currents provided. As described above, the combination of the word line currents and the sense line currents causes the magneto-resistive bits 112a and 112b to be written into opposite magneto-resistive states, and in the illustrative embodiment, into a state that corresponds to a logic "1". To complete the illustrative write operation, the write current-1 terminals 114, write-1 terminal 200 and the select-1 terminal 130 are deselected.

Region 182 shows a write operation that writes a "0" to magneto-resistive memory element 102b. For this write operation, the write current-1 terminals 114 are again asserted, but now provide a negative write current pulse 216 to word lines 106a and 106b. The write-1 terminal 200 is also asserted as shown at 218, which closes the word line switch 108a and connects word lines 106a and 106b as shown. The word line current provided to write current-1 terminals 114 thus passes down word line 106b, through word line switch 108a, and up word line 106a. To select magneto-resistive memory element 102b, the select-2 terminal 204 is asserted as shown at 220. This turns on the switch transistors in magneto-resistive memory element 102b, which draws a sense current from word lines 106a and 106b and through the corresponding magneto-resistive bits. Preferably, the select-2 terminal 204 is only asserted to a level that allows the switch transistors in the magneto-resistive memory element 102b to operate in the saturation region to limit the magnitude of the sense currents provided. As described above, the combination of the word line currents and the sense line currents causes the magneto-resistive bits to be written into opposite magneto-resistive states, and in the illustrative embodiment, into a state that corresponds to a logic "0". To complete the illustrative write operation, the write current-1 terminals 114, write-1 terminal 200 and the select-2 terminal 204 are deselected.

Region 184 shows a write operation that writes a "1" to magneto-resistive memory element 102d. For this write operation, the write current-N terminals 116 are asserted to provide a positive write current pulse 222 to word lines 106c and 106d. The write-N terminal 202 is also asserted as shown at 224, which closes the word line switch 108b and connects word lines 106c and 106d as shown. The word line current provided to write current-N terminals 116 thus passes down word line 106c, through word line switch 108b, and up word line 106d. To select magneto-resistive memory element 102d, the select-1 terminal 130 is asserted as shown at 226. This turns on the switch transistors in magneto-resistive memory element 102d, which draw a sense current from word lines 106c and 106d and through the corresponding magneto-resistive bits. Preferably, the select-1 terminal 130 is only asserted to a level that allows the switch transistors in the magneto-resistive memory element 102d to operate in the saturation region to limit the magnitude of the sense currents provided. As described above, the combination of the word line currents and the sense line currents causes the magneto-resistive bits to be written into opposite magneto-resistive states, and in the illustrative embodiment, into a state that corresponds to a logic "1". To complete the illustrative write operation, the write current-N terminals 116, write-N terminal 202 and the select-1 terminal 130 are deselected.

Region 186 shows a write operation that writes a "0" to magneto-resistive memory element 102e. For this write operation, the write current-N terminals 116 are again asserted, but now provide a negative write current pulse 228 to word lines 106c and 106d. The write-N terminal 202 is also asserted as shown at 230, which closes the word line switch 108b and connects word lines 106c and 106d as shown. The word line current provided to write current-N terminals 116 thus passes down word line 106d, through word line switch 108b, and up word line 106c. To select magneto-resistive memory element 102e, the select-2 terminal 204 is asserted as shown at 232. This turns on the switch transistors in magneto-resistive memory element 102e, which draws a sense current from word lines 106c and 106d and through the corresponding magneto-resistive bits. Preferably, the select-2 terminal 204 is only asserted to a level that allows the switch transistors in the magneto-resistive memory element 102e to operate in the saturation region to limit the magnitude of the sense currents provided. As described above, the combination of the word line currents and the sense line currents causes the magneto-resistive bits to be written into opposite magneto-resistive states, and in the illustrative embodiment, into a state that corresponds to a logic "0". To complete the illustrative write operation, the write current-N terminals 116, write-N terminal 202 and the select-2 terminal 204 are deselected.

Region 188 shows a read operation for reading magneto-resistive memory element 102a. During the illustrative read operation, the load-1 terminal 120 is activated as shown at 234. Activating the load-1 terminal 120 causes the load transistor 144 to connect the inputs of the first inverter 140 and the second inverter 142. Because the first inverter 140 and second inverter 142 are in a cross-coupled configuration, this causes the first inverter 140 and second inverter 142 to go into an intermediate state, and in particular, into a state where both the n-channel and p-channel transistors are at least partially on. Because both the n-channel and p-channel transistors are at least partially on, a sense line current path is provided to each of the first and second word lines 106a and 106b. The resistance of each sense line current path is preferably substantially identical so that the sense line current provided to the first word line 106a and the sense line current provided to the second word line 106b are substantially identical. The write-1 terminal 200 remains off, thereby effectively disconnecting word line 106a from word line 106b.

To select magneto-resistive memory element 102a, the select-1 terminal 130 is activated as shown at 236. This turns on the switch transistors in magneto-resistive memory element 102a, which draws the read sense currents from word lines 106a and 106b through magneto-resistive bits 112a and 112b, respectively. To reduce the resistance that is in series with the magneto-resistive bits 112a and 112b, the select-1 terminal 130 is preferably activated at a level that allows the switch transistors in the magneto-resistive memory element 102a to operate in the linear region, and preferably fully turned on. This may help increase the sensitivity of the read operation by minimizing the resistance of the switch transistors.

Because the magneto-resistive bits 112a and 112b are in opposite resistive states, the sense line currents that pass through the first and second magneto-resistive bits produce different voltages at the first and second word lines 106a and 106b. This voltage differential is provided to the negative supply terminals 146 and 148 of the first and second inverters 140 and 142 via word lines 106a and 106b, respectively. Thereafter, the load-1 terminal 120 is released. Releasing the load-1 terminal 120 causes the cross-coupled inverter pair 140 and 142 to assume the data state that corresponds to the voltage differential that is present at the negative supply terminals 146 and 148. This state is stored by the cross-coupled inverter pair and provided to the out1-1 terminal 206 as shown at 238.

Finally, region 190 shows a read operation that reads magneto-resistive memory element 102b. During this illustrative read operation, the load-1 terminal 120 is again activated as shown at 240. Activating the load-1 terminal 120 causes the load transistor is 144 to connect the inputs of the first inverter 140 and the second inverter 142. Because the first inverter 140 and second inverter 142 are in a cross-coupled configuration, this causes the first inverter 140 and second inverter 142 to go into an intermediate state, and in particular, into a state where both the n-channel and p-channel transistors are at least partially on. Because both the n-channel and p-channel transistors are at least partially on, a sense line current path is provided to each of the first and second word lines 106a and 106b. The resistance of each sense line current path is preferably substantially identical so that the sense line current provided to the first word line 106a and the sense line current provided to the second word line 106b are substantially identical. The write-1 terminal 200 remains off, thereby effectively disconnecting word line 106a from word line 106b.

To select magneto-resistive memory element 102b, the select-2 terminal 204 is activated as shown at 242. This turns on the switch transistors in magneto-resistive memory element 102b, which draws the read sense currents from word lines 106a and 106b through the corresponding magneto-resistive bits. To reduce the resistance that is in series with the magneto-resistive bits, the select-2 terminal 204 is preferably activated at a level that allows the switch transistors in the magneto-resistive memory element 102b to operate in the linear region, and preferably fully turned on. This may help increase the sensitivity of the read operation by minimizing the resistance of the switch transistors.

Because the magneto-resistive bits are in opposite resistive states, the sense line currents that pass through the first and second magneto-resistive bits produce different voltages at the first and second word lines 106a and 106b. This voltage differential is provided to the negative supply terminals 146 and 148 of the first and second inverters 140 and 142 via word lines 106a and 106b, respectively. Thereafter, the load-1 terminal 120 is released. Releasing the load-1 terminal 120 causes the cross-coupled inverter pair 140 and 142 to assume the data state that corresponds to the voltage differential that is present at the negative supply terminals 146 and 148. This state is stored by the cross-coupled inverter pair and provided to the out1-1 terminal 206 as shown at 244.

Figure 6:
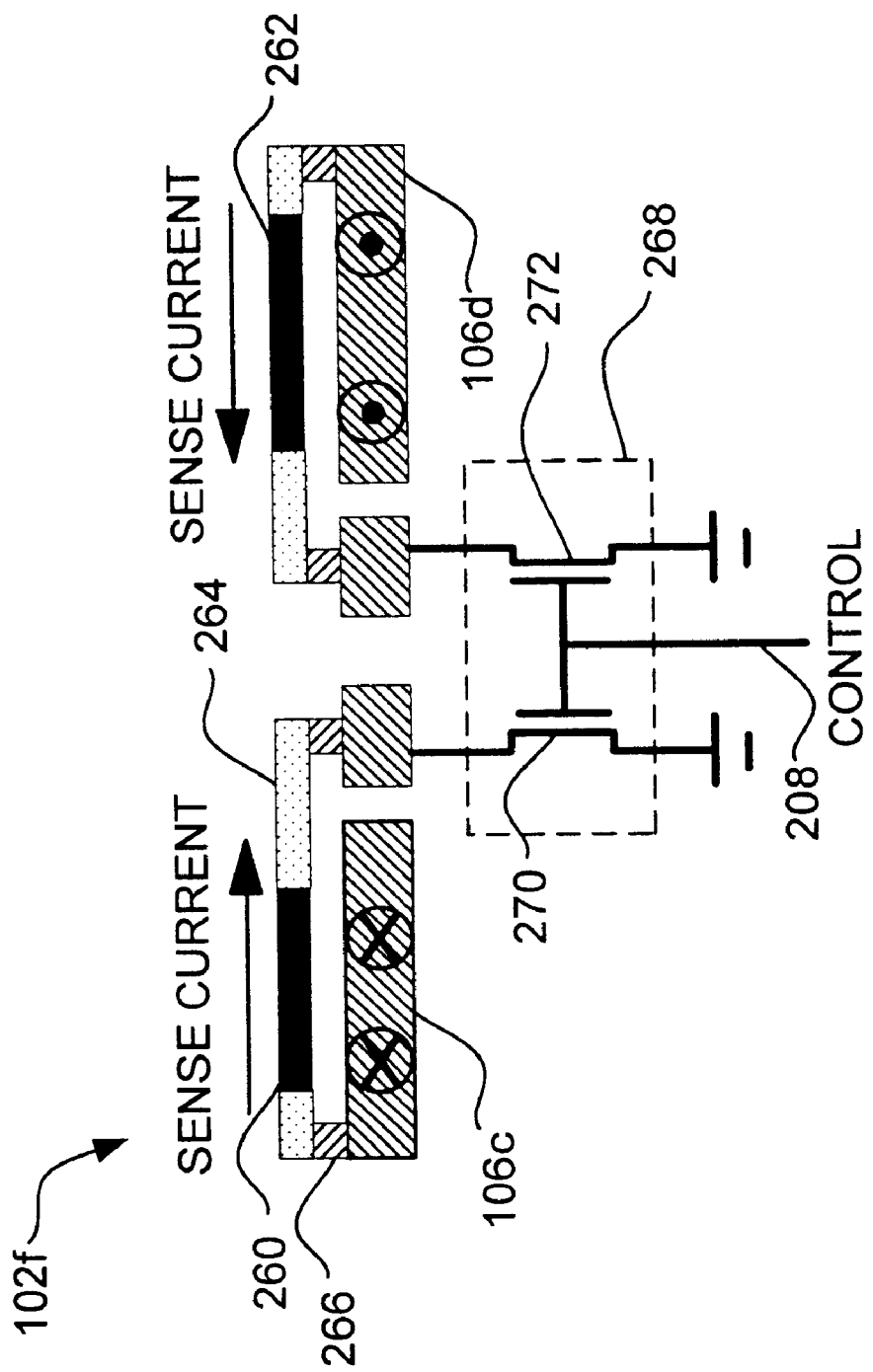
FIG. 6 is a partial cross-sectional side view of an illustrative magneto-resistive memory element in accordance with the present invention.

FIG. 6 is a partial cross-sectional side view of the magneto-resistive memory element 102f of FIG. 4 taken along line 6—6. The magneto-resistive memory element is generally shown at 120f, and includes a magneto-resistive bit 260, a magneto-resistive bit 262 and switch block 268.

The switch block 268 preferably includes a first transistor 270 and a second transistor 272. The first and second transistors 270 and 272 are preferably fabricated into the under-layers of an integrated circuit, and adjacent the location of corresponding magneto-resistive bits 260 and 262. The gates of the first transistor 270 and a second transistor 272 are preferably coupled to a buffer or the like (not shown), which is also fabricated into the under-layers of the integrated circuit. The gates of the first and second transistors 270 and 272 are preferably coupled to the buffer via a metal interconnect line, a poly-silicon line, or a combination thereof.

A first insulating layer is then preferably provided over the first and second transistors 270 and 272. A metal layer may then be provided over the first insulating layer and selectively etched to form word lines 106c and 106d. A second insulating layer may then be provided over word lines 106c and 106d. Via holes may then be cut through the second insulating layer down to the word lines 106c and 106d.

The top surface of the second insulting layer is preferably planarized using a Chemical-Mechanical-Polishing (CMP) step. Once planarized, magneto-resistive bits 260 and 262 are provided. Magneto-resistive bits 260 and 262 preferably have a lower ferromagnetic thin film, an upper ferromagnetic thin film, and a thin non-ferromagnetic layer therebetween. One purpose of the thin non-ferromagnetic layer is to de-couple the magnetization vectors of the lower and upper ferromagnetic layers. The thin non-ferromagnetic layer may be, for example, copper. The upper and lower ferromagnetic thin film layers preferably exhibit uni-axial anisotropy, magneto-resistance, little magneto-striction, and are of an alloy composition that includes nickel, cobalt and iron. The magnetic device structure can be a spin valve that includes a pinned reference layer spaced apart from a free layer that stores the digital information. The lower ferromagnetic thin film is typically, but not always, thicker than the upper ferromagnetic thin film. Alternatively, a pseudo-spin valve structure can be used, where the lower ferromagnetic thin film is often called the hard layer, and the upper ferromagnetic thin film is often called the soft layer. For the memory shown in FIG. 4, the magnetization vector of the pinned layer preferably remains pointing in a single direction such as to the left during both read and write operations.

Once formed, the magneto-resistive bits 260 and 262 are preferably covered with a third insulating layer. The third insulating layer may be selectively removed to expose the bit ends of magneto-resistive bits 260 and 262. Yet another metal layer may then be used to connect one end of magneto-resistive bits 260 and 262 to the word lines 106c and 106d, respectively, preferably using one or more of the previously formed via holes, such as via hole or contact structure 266. The same metal layer may also be used to connect the other ends of magneto-resistive bits 260 and 262 to the drain terminals of transistors 270 and 272, respectively.

As can readily be seen, a word line is provided adjacent each of the magneto-resistive bits 260 and 262. One end of each of the magneto-resistive bits 260 and 262 is connected to the corresponding word line 106c and 106d, and the other end is connected to a predetermined voltage such as ground through switch block 268. The switch block 268 selectively provides a path for a sense current to flow from the word lines 106c and 106d through magneto-resistive bits 260 and 262 and to ground. Accordingly, word line 106c delivers the word line current and the sense line current for magneto-resistive bit 260, and the word line 106d delivers the word line current and the sense line current for magneto-resistive bit 262.

Figure 7:
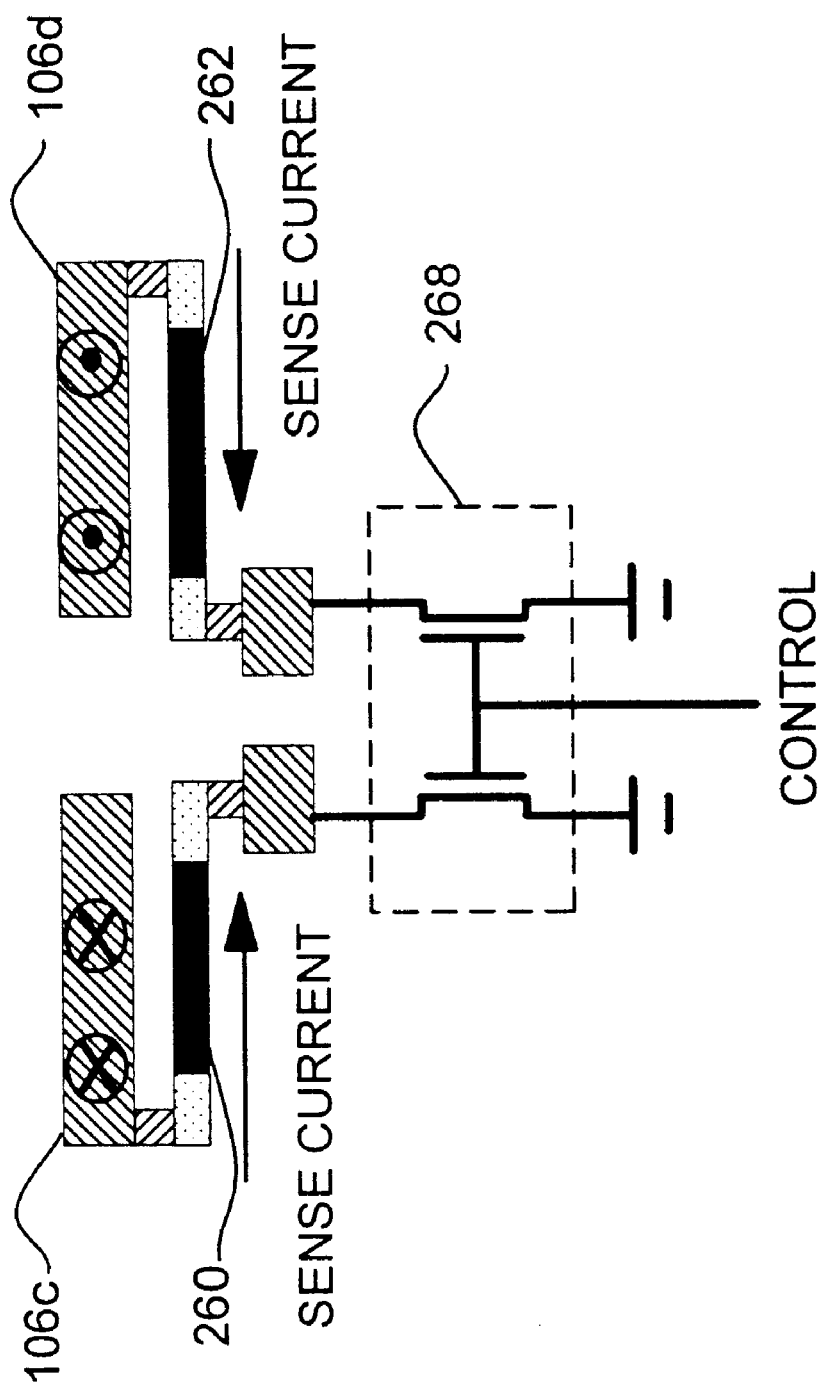
FIG. 7 is a partial cross-sectional side view of yet another illustrative magneto-resistive memory element in accordance with the present invention.

FIG. 7 is a partial cross-sectional side view of yet another illustrative magneto-resistive memory element in accordance with the present invention. This illustrative embodiment is similar to that shown and described above with respect to FIG. 6. However, the word lines 106c and 106d are positioned above the magneto-resistive bits 260 and 262, rather than below.

Having thus described the preferred embodiments of the present invention, those of skill in the art will readily appreciate that the teachings found herein may be applied to yet other embodiments within the scope of the claims hereto attached.

What is claimed is:

1. A magneto-resistive storage element comprising:

a magneto-resistive bit having a first end and a second end;

a word line extending adjacent the magneto-resistive bit, the word line connected to the first end of the magneto-resistive bit; and switching means coupled to the second end of the magneto-resistive bit for selectively providing a path for a sense current to flow from the word line, through at least part of the magneto-resistive bit, and to a predetermined voltage terminal.

2. A magneto-resistive storage element according to claim 1, wherein the switching means comprises a transistor.

3. A magneto-resistive storage element according to claim 1, wherein the predetermined voltage terminal is coupled to ground.

4. A magneto-resistive storage element according to claim 1, wherein the magneto-resistive bit is an elongated magneto-resistive bit having a length and a width.

5. A magneto-resistive storage element according to claim 4, wherein the word line is configured to carry a word line current that produces a word line magnetic field component that extends along the length of the elongated magneto-resistive bit.

6. A magneto-resistive storage element according to claim 5, wherein the sense current produces a write sense magnetic field component that extends along the width of the elongated magneto-resistive bit.

7. A magneto-resistive storage element according to claim 1, wherein the word line is a metal word line that extends above or below the magneto-resistive bit.

8. A magneto-resistive storage element according to claim 7, further comprising connecting means for connecting the metal word line to the first end of the magneto-resistive bit, the connecting means including a via or contact structure.

9. A magneto-resistive storage element according to claim 1, wherein the switching means has at least two resistive modes, including:

an intermediate resistive mode for providing a path for a write sense current to flow from the word line; and a lower resistive mode for providing a path for a read sense current to flow from the word line.

10. A magneto-resistive storage element according to claim 9, wherein the switching means further includes a higher resistive mode for substantially preventing the write sense current and the read sense current from flowing from the word line.

11. A magneto-resistive storage device comprising:

a magneto-resistive bit having a first end and a second end;

a word line extending adjacent the magneto-resistive bit, the word line connected to the first end of the magneto-resistive bit;

word line current providing means for selectively providing a word line current to the word line;

switching means coupled to the second end of the magneto-resistive bit for selectively providing a path for a read or a write sense current to flow from the word line, through at least part of the magneto-resistive bit, and to a predetermined voltage terminal;

reading means coupled to the word line for providing a path for the read sense current to flow to the word line, the reading means reading the resistive state of the magneto-resistive bit via the read sense current; and controller means for controlling the word line current providing means, the switching means, and the reading means;

the controller means performing a write of the magneto-resistive bit by enabling the word line current providing means to provide a word line current to the word line, enabling the switching means to provide a path for the write sense current to flow from the word line, through at least part of the magneto-resistive bit, and to the predetermined voltage terminal, and disabling the reading means to prevent the reading means from providing a path for the read sense current to flow to the word line; and the controller means performing a read of the magneto-resistive bit by disabling the word line current providing means to prevent the word line current providing means from providing a word line current to the word line, enabling the switching means to provide a path for the read sense current to flow from the word line, through at least part of the magneto-resistive bit, and to the predetermined voltage terminal, and enabling the reading means to provide a path for the read sense current to flow to the word line and to read the resistive state of the magneto-resistive bit via the read sense current.

12. A magneto-resistive storage device according to claim 11, wherein the switching means has at least two resistive modes, including:

an intermediate resistive mode for providing a path for the write sense current to flow from the word line, through at least part of the magneto-resistive bit, and to the predetermined voltage terminal; and a lower resistive mode for providing a path for the read sense current to flow from the word line, through at least part of the magneto-resistive bit, and to the predetermined voltage terminal.

13. A magneto-resistive storage device according to claim 12, wherein the switching means further includes a higher resistive mode for substantially preventing the write sense current and the read sense current from flowing from the word line.

14. A magneto-resistive storage device according to claim 13, wherein the switching means comprises a transistor.

15. A magneto-resistive storage element according to claim 14, wherein the predetermined voltage terminal is coupled to ground.

16. A magneto-resistive storage element comprising:

a first magneto-resistive bit having a first end and a second end;

a second magneto-resistive bit having a first end and a second end;

a word line extending adjacent the first and second magneto-resistive bits such that a word line current passing through the word line provides a magnetic field component toward one end of the first magneto-resistive bit and toward the other end of the second magneto-resistive bit, the word line connected to the first end of the first magneto-resistive bit and the first end of the second magneto-resistive bit; and switching means coupled to the second end of the first magneto-resistive bit and the second end of the second magneto-resistive bit for selectively providing a path for a write sense current to flow from the word line, through at least part of the first and second magneto-resistive bits, and to a predetermined voltage terminal.

17. A magneto-resistive storage element according to claim 16, wherein the switching means has at least two resistive modes, including:

an intermediate resistive mode for providing a path for the write sense current to flow from the word line, through at least part of the first and second magneto-resistive bits, and to the predetermined voltage terminal; and a lower resistive mode for providing a path for a read sense current to flow from the word line, through at least part of the first and second magneto-resistive bits, and to the predetermined voltage terminal.

18. A magneto-resistive storage element according to claim 17, wherein the switching means further includes a higher resistive mode for substantially preventing the write sense current and the read sense current from flowing from the word line, through at least part of the first and second magneto-resistive bits, and to the predetermined voltage terminal.

19. A magneto-resistive storage element according to claim 16, wherein the switching means comprises a transistor having a source, a drain and a gate, the drain of the transistor being coupled to the second end of the first magneto-resistive bit and the second end of the second magneto-resistive bit, the source of the transistor being coupled to the predetermined voltage terminal, and the gate of the transistor being coupled to a control terminal.

20. A magneto-resistive storage element according to claim 16, wherein the switching means comprises a first transistor and a second transistor each having a source, a drain and a gate, the drain of the first transistor being coupled to the second end of the first magneto-resistive bit, the drain of the second transistor being coupled to the second end of the second magneto-resistive bit, the source of the first transistor and the source of the second transistor being coupled to the predetermined voltage terminal, and the gate of the first transistor and the gate of the second transistor being coupled to a control terminal.

\* \* \* \* \*